(12) United States Patent
Ishida et al.

(10) Patent No.: US 8,981,788 B2
(45) Date of Patent: Mar. 17, 2015

(54) CAPACITOR POWER SUPPLY, VOLTAGE MONITORING DEVICE, METHOD OF MONITORING VOLTAGE, AND METHOD OF MANUFACTURING CAPACITOR POWER SUPPLY

(71) Applicant: Taiyo Yuden Co., Ltd., Tokyo (JP)

(72) Inventors: Katsuei Ishida, Tokyo (JP); Osamu Hamada, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 14/453,327

(22) Filed: Aug. 6, 2014

(65) Prior Publication Data

US 2015/0042348 A1  Feb. 12, 2015

(30) Foreign Application Priority Data

Aug. 7, 2013  (JP) .................. 2013-164443

(51) Int. Cl.
*G01R 31/12* (2006.01)
*G01R 35/00* (2006.01)
*G01R 31/36* (2006.01)

(52) U.S. Cl.
CPC .......... *G01R 35/005* (2013.01); *G01R 31/3606* (2013.01)

USPC .......... 324/548; 324/512; 324/357; 320/166; 320/134

(58) Field of Classification Search
USPC .................. 324/512, 519, 548, 537
See application file for complete search history.

(56) References Cited

U.S. PATENT DOCUMENTS

| | | | | | |
|---|---|---|---|---|---|
| 5,568,035 | A | * | 10/1996 | Kato et al. | 320/166 |
| 6,107,808 | A | * | 8/2000 | McKee et al. | 324/548 |
| 8,008,892 | B2 | * | 8/2011 | Kikuchi | 320/134 |
| 2014/0253040 | A1 | * | 9/2014 | Michalske et al. | 320/126 |

FOREIGN PATENT DOCUMENTS

| | | |
|---|---|---|
| JP | 2010-271267 A | 12/2010 |
| JP | 2012-115103 A | 6/2012 |

* cited by examiner

*Primary Examiner* — Huy Q Phan
*Assistant Examiner* — Dustin Dickinson
(74) *Attorney, Agent, or Firm* — Chen Yoshimura LLP

(57) ABSTRACT

In a calibration process, a capacitor unit is removed from end terminals, or namely, respective capacitors are not connected to terminals. A prescribed voltage (a known voltage) is applied between these end terminals. Among bypass switches of a bypass circuit, the bypass switches connected to one terminal or two or more consecutive terminal pairs from the positive end terminal side are ON. Terminal voltages other than the negative end terminal are obtained and stored as calibration information.

6 Claims, 7 Drawing Sheets

CAPACITOR POWER SUPPLY, VOLTAGE MONITORING DEVICE, METHOD OF MONITORING VOLTAGE, AND METHOD OF MANUFACTURING CAPACITOR POWER SUPPLY

BACKGROUND OF THE INVENTION

1. Field of the Invention

The present invention relates to a capacitor power supply having a capacitor unit that is a plurality of capacitors connected in series, a power monitoring device for use therewith, a method of monitoring power, and a method of manufacturing the capacitor power supply.

2. Description of Related Art

Electrochemical capacitors that use an electric double-layer (hereinafter, "capacitors") have a longer life cycle and are more capable of rapid charging and large current discharge than conventional secondary batteries. Therefore, there is hope for these capacitors to be a storage device that can be used for energy regeneration and the like.

When using capacitors to regenerate energy, reclaim energy, and the like, for example, it is common to form a capacitor module in which a plurality of capacitors are connected in series, due to the low rated voltage of the capacitors.

When charging and discharging these capacitors that are connected in series, however, variation occurs in the voltages between the terminals of the capacitor modules due to differences in the electrostatic capacitances of the individual capacitors and because of leakage current. In such a case, one capacitor among the plurality of capacitors exceeding the rated voltage will cause degradation of this single capacitor. If the voltage applied to the individual capacitors is set to be low so as to not exceed the rated voltage, then the capacitances of the capacitors cannot be used effectively.

An unequal voltage suppression circuit disclosed in Patent Document 1 includes switches and resistors connected to respective capacitors in parallel. When capacitors are being charged, this circuit monitors the voltage between the terminals of the respective capacitors and closes a switch connected to one or more capacitors that have a voltage between the terminals thereof higher than a prescribed tolerance level, which is higher than the voltage between the terminals of the other switches, for example. Thereafter, the current is consumed by the resistor connected to these capacitors, and the amount of charge to these capacitors is reduced. Therefore, the rate of increase of voltage between the terminals of these capacitors is slower than the rate of increase of voltage between the terminals of other capacitors that do not have a resistor connected thereto. As a result, variation in voltage between the respective terminals is suppressed during charging (see paragraph [0022] in the specification of Patent Document 1, for example).

A cell monitoring unit in a cell monitoring device disclosed in Patent Document 2 includes a balancer having resistors and switches respectively connected in parallel to a plurality of battery cells that are connected in series. When a switch of the balancer is ON and OFF, the cell monitoring unit measures the voltage of the battery cells by using a voltage measuring circuit, and if the difference in the measured voltage during ON and OFF is larger than a threshold, an abnormality of the battery cells or circuits is judged to have occurred (see paragraph [0018] in the specification of Patent Document 2, for example).

Related Art Document

Patent Document

Patent Document 1: Japanese Patent Application Laid-Open Publication No. 2012-115103

Patent Document 2: Japanese Patent Application Laid-Open Publication No. 2010-271267

SUMMARY OF THE INVENTION

However, in devices such as these, variations in the measured voltage of the respective capacitors can also occur due to individual differences in the circuits or devices. If the capacitance of the capacitors is to be fully utilized, then the voltage of the capacitors must be accurately measured and variation caused by such individual differences must be suppressed.

The present invention aims at providing a capacitor power supply that can increase measurement accuracy of the voltage of capacitors, a voltage monitoring device, a method of monitoring voltage, and a method of manufacturing the capacitor power supply.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present invention provides a capacitor power supply that includes: a plurality of terminals including a first terminal and a second terminal that are on respective ends of the plurality of terminals, the plurality of terminals being configured to connect a plurality of capacitors in series when the capacitors are inserted between respective terminals; a bypass circuit having bypass switches connected in parallel between the respective terminals that constitute the plurality of terminals; a voltage detecting unit that can detect a voltage of at least terminals among the plurality of terminals other than the second terminal; a storage unit that stores calibration information that is determined based on a voltage detected by the voltage detecting unit when a prescribed voltage is inputted between the first terminal and the second terminal while the plurality of capacitors are not respectively connected to the plurality of terminals and while one or more of the bypass switches that are consecutive from a side of the first terminal are closed; and a calibration unit that calibrates voltages detected by the voltage detecting unit based on the calibration information when the plurality of capacitors are respectively connected to the plurality of terminals.

In other aspects, methods associated with the above-mentioned aspect of the present invention and voltage monitoring features of the above-mentioned aspect of the present invention are provided.

It is to be understood that both the foregoing general description and the following detailed description are exemplary and explanatory, and are intended to provide further explanation of the invention as claimed.

DETAILED DESCRIPTION OF THE PREFERRED EMBODIMENTS

In the above-mentioned capacitor power supply, the voltage detected when a prescribed voltage is inputted between the first and the second terminal while the capacitors are not connected to the plurality of terminals and while the bypass switches are closed is a voltage that reflects variation in individual differences of the components and the like included in the various types of circuits. This capacitor power supply can calibrate voltages detected while the capacitors are connected to the respective terminals by storing the above-mentioned calibration information that is based on the above-mentioned voltage. In other words, it is possible to increase the measurement accuracy of the voltage of the capacitors.

The storage unit may store, as the calibration information, calibration information based on the voltage detected while the bypass switches are closed, except for the bypass switches connected between the second terminal and terminals adjacent to the second terminal among the plurality of terminals.

Structurally, even if the bypass switches of the bypass circuit connected between the second terminal and the terminals adjacent to the second terminal are not electrically connected to the second terminal, the capacitor power supply can obtain all the detected voltage values from the voltage detecting unit as inputted from the respective terminals.

The capacitor power supply may further include voltage-dividing resistor circuits connected to the respective terminals of the capacitor power supply except for the second terminals, and the voltage detecting unit may detect the respective voltages of the terminals whose voltages have been divided by the voltage-dividing resistor circuits.

This allows for such voltage-dividing resistor circuits to be provided when the voltage at the time of measurement exceeds the detection range of the voltage detecting unit. According to the present invention, if such voltage-dividing resistor circuits are provided, then the calibration information of the voltage when the respective capacitors are not connected can be stored with individual differences in the respective resistors of the voltage-dividing resistor circuits; thus, these individual differences in the resistors can be absorbed.

The bypass circuit may have bypass resistors that are connected in series to the respective bypass switches and that have a lower resistance than resistors included in the respective voltage-dividing resistors.

The terminals can in effect be short circuited when the bypass switches are closed due to the bypass resistors having a sufficiently lower resistance than the resistors included in the respective voltage-dividing resistor circuits. The same situation occurs when using a jig such as a connection cable to short circuit the terminals, and therefore, it is not necessary to use such a jig.

An embodiment of the present invention will be described below with reference to the drawings.

1. Configuration of Capacitor Power Supply

Figure 1:
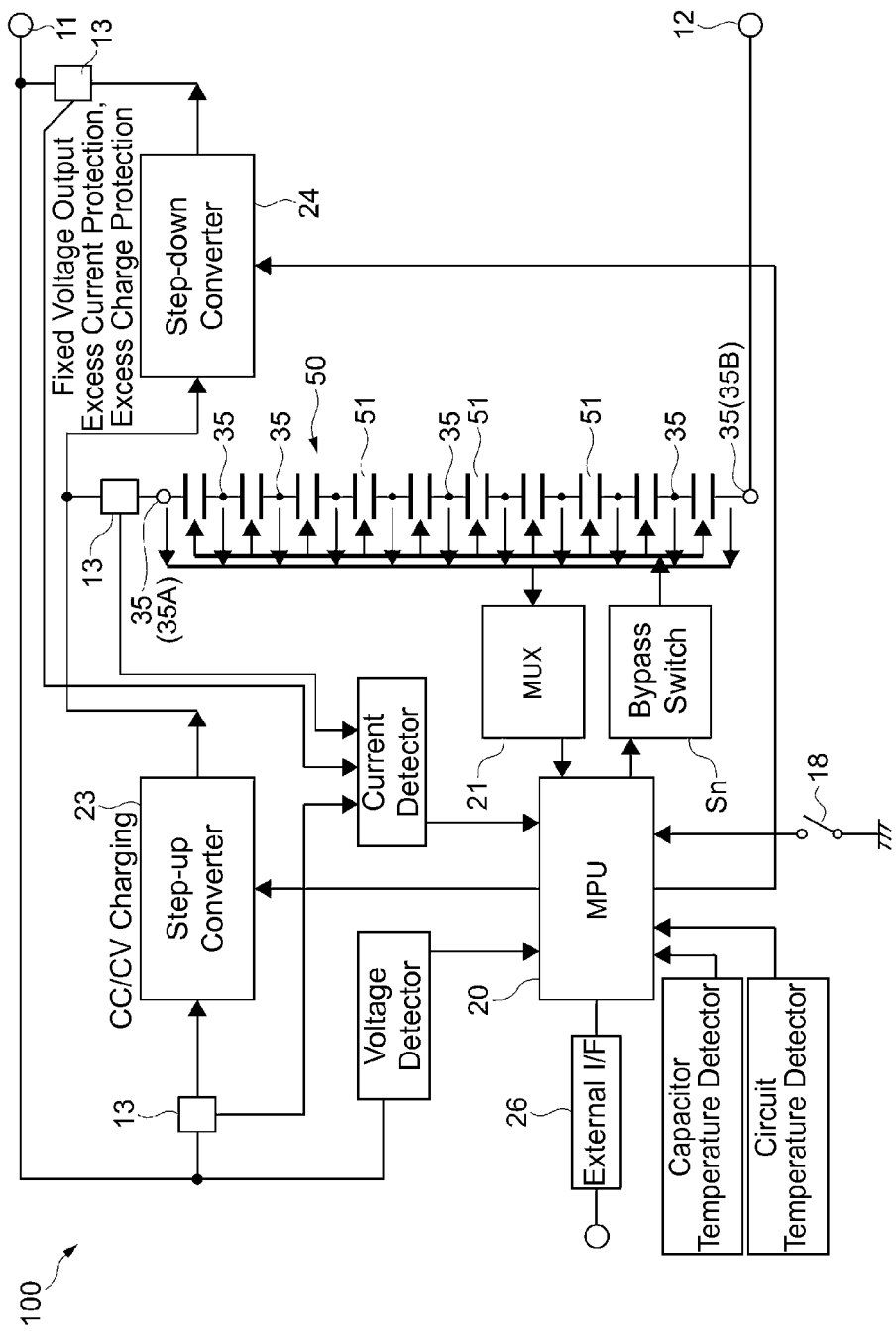
FIG. 1 is a block diagram showing a functional configuration of a capacitor power supply capable of being used with a voltage monitoring device of one embodiment of the present invention.

FIG. 1 is a block diagram showing a functional configuration of a capacitor power supply capable of being used with a voltage monitoring device of one embodiment of the present invention.

A capacitor power supply 100 includes a capacitor unit 50 in which a plurality of electrochemical capacitors (hereinafter, "capacitors") 51 that use an electric double-layer are connected in series. The capacitor unit 50 is detachable to allow for changing of components. The capacitor unit 50 itself may be capable of being changed, or the respective capacitors 51 may be capable of being individually changed with respect to respective terminals 35.

A lithium-ion capacitor (LIC) is typically used as the material for the capacitors 51, but the material is not limited thereto. The capacitor unit 50 has ten capacitors 51, for example, but the number of capacitors 51 is not limited thereto.

The capacitor power supply 100 has main terminals (a negative terminal 11 and a positive terminal 12) for the input and output of energy, an MPU (micro-processing unit) 20, a step-up converter 23, and a step-down converter 24.

An end terminal 35A (a first end terminal of the respective terminals 35 for connecting the plurality of capacitors 51 in series) on the positive side of the capacitor unit 50 is connected to the main terminal 11 on the positive side through the step-up converter 23 and the step-down converter 24. An end terminal 35B (a second end terminal of the respective terminals 35 for connecting the plurality of capacitors 51 in series) on the negative side of the capacitor unit 50 is connected to the main terminal 12 on the negative side. The step-up converter 23 and the step-down converter 24 can each be a DC/DC converter, for example.

The positive end terminal 35A and the main terminal 11 on the positive side may be the same terminal.

The MPU 20 mainly controls the charge/discharge of the capacitor unit 50, monitors the voltage of the capacitors 51, and the like. When a power source for charging (not shown) is connected between the main terminals 11 and 12, the MPU 20 controls the step-up converter 23 to perform constant-current charging and constant-voltage charging of the capacitor unit 50. When a load (not shown) is connected between the main terminals 11 and 12, the MPU 20 controls the step-down converter 24 to discharge to the load while maintaining a fixed output voltage.

The capacitor power supply 100 has a multiplexer 21, bypass switches $S_n$, and the like.

The multiplexer 21 connects to the respective terminals 35 of the capacitor unit 50 and selectively switches analog values of the voltage of the respective terminals 35, which are then inputted to the MPU 20. The multiplexer 21 may not be necessary, depending on the number of ports of the AD converter embedded in the MPU 20 (i.e., if the number of ports are increased).

The bypass switches $S_n$ switch ON/OFF the connection of a bypass circuit 22 (described later) to the capacitor unit 50.

The MPU 20 of the capacitor power supply 100 can detect the current and voltage of prescribed locations. The MPU 20 uses respective resistors 13 to detect input current from a charging source (not shown), input current to the capacitor unit 50, and output current to the load, for example. The MPU 20 can also detect the voltage of the main terminal 11.

In this capacitor power supply 100, it is possible to detect the temperature of the capacitors 51 and the temperature of the circuits. An external I/F 26 for serial communication is also disposed in the capacitor power supply 100.

2. Configuration of Voltage Monitoring Device

Figure 2:
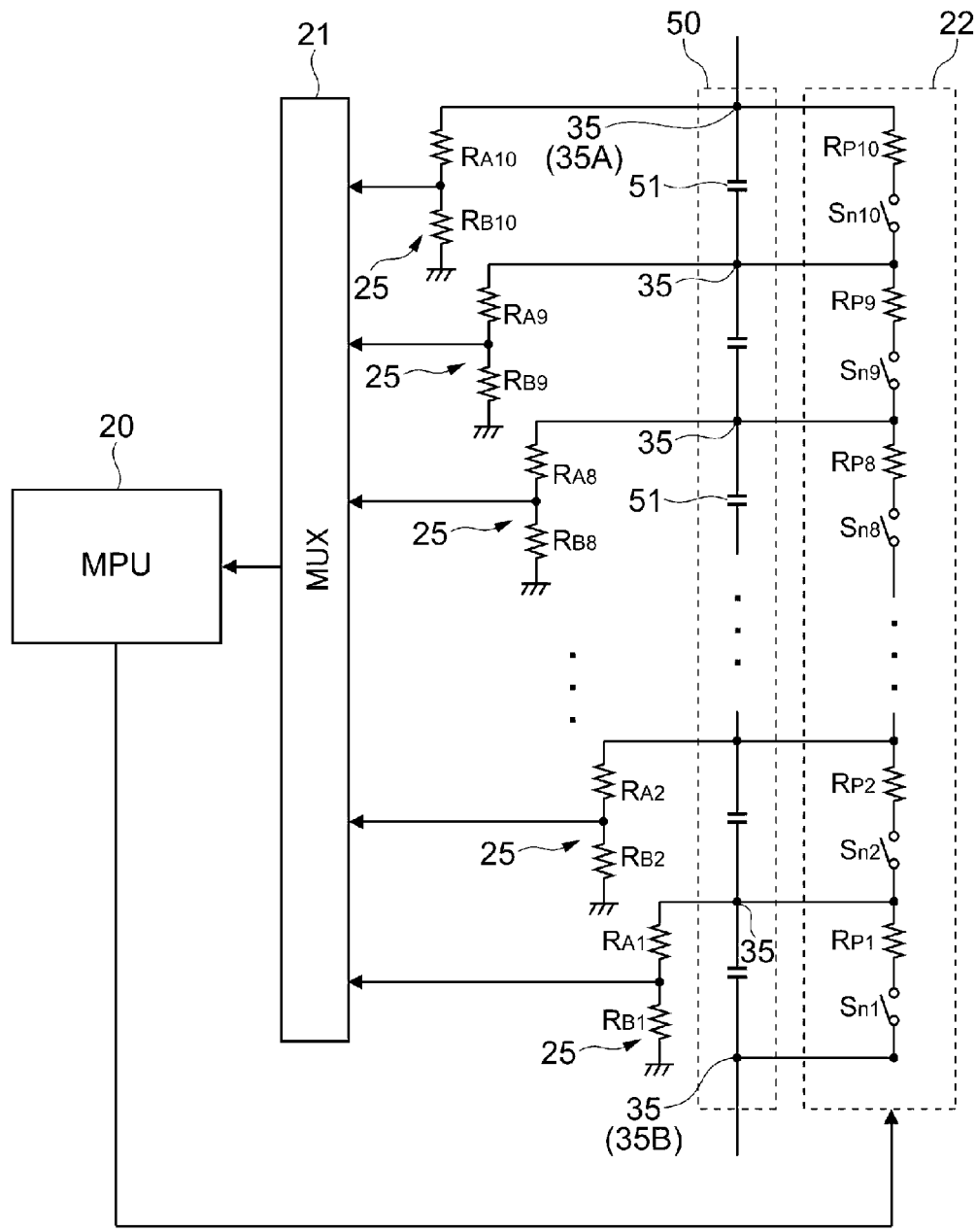
FIG. 2 shows the voltage monitoring device according to one embodiment of the present invention.

FIG. 2 shows the voltage monitoring device according to the present embodiment. The voltage monitoring device has the bypass circuit 22, which includes the bypass switches $S_n$ mentioned above.

The bypass circuit 22 has bypass resistors $R_{Pn}$ (n=1, 2, ..., 10) and the bypass switches $S_n$ (n=1,2, ..., 10), which are connected in parallel between the respective terminals 35 that connect the respective capacitors 51 of the capacitor unit 50 in series. The ON/OFF switching of the bypass switches $S_n$ is controlled by the MPU 20.

Voltage-dividing circuits 25 constituted of voltage-dividing resistors $R_{An}$ and $R_{Bn}$ (n=1,2, ..., 10) are connected to the respective terminals 35. The voltage-dividing circuits 25 may be a part of the multiplexer 21. The MPU 20 obtains the voltages of the terminals 35 of the respective capacitors 51 as analog quantities via the voltage-dividing circuits 25 and converts this to a digital value by using AD conversion. In this case, the MPU 20 mainly functions as a voltage detecting unit.

The MPU 20 controls the bypass circuit 22 on the basis of the obtained terminal voltages of the respective capacitors 51. When one of the detected terminal voltages exceeds the prescribed voltage threshold for the terminal in question, the MPU 20 turns ON the corresponding bypass switch $S_n$ connected in parallel with the terminal where the voltage that exceeds the voltage threshold has been detected. This causes current to flow to the corresponding bypass resistors $R_{Pn}$, and thus, the voltage of the capacitor 51 connected between the respective terminals 35 where the voltage that has exceeded the voltage threshold is detected can be lowered. Hereinafter, this is referred to as "balance control."

The resistance of the voltage-dividing resistors $R_{An}$ (and $R_{Bn}$) is several kΩ to several dozen kΩ. Meanwhile, the resistance of the bypass resistors $R_{Pn}$ is lower than the voltage-dividing resistors $R_{An}$ and $R_{Bn}$. The resistance of the bypass resistors $R_{Pn}$ is several Ω to several dozen Ω, and set at a sufficiently lower value than the resistance of the voltage-dividing resistors $R_{An}$ (and $R_{Bn}$), for example. In other words, the resistance of the bypass resistors $R_{Pn}$ is approximately 1/10,000 to 1/100 of the resistance of the voltage-dividing resistors $R_{An}$ (and $R_{Bn}$).

3. Calibration Process

Next, a calibration process for increasing measurement accuracy of the voltages of the respective capacitors 51 using the voltage monitoring device as described above will be explained.

This calibration process can be performed during manufacturing (including design) of the capacitor power supply 100, during use of the capacitor power supply 100 by the user, or during both of these.

Figure 3:
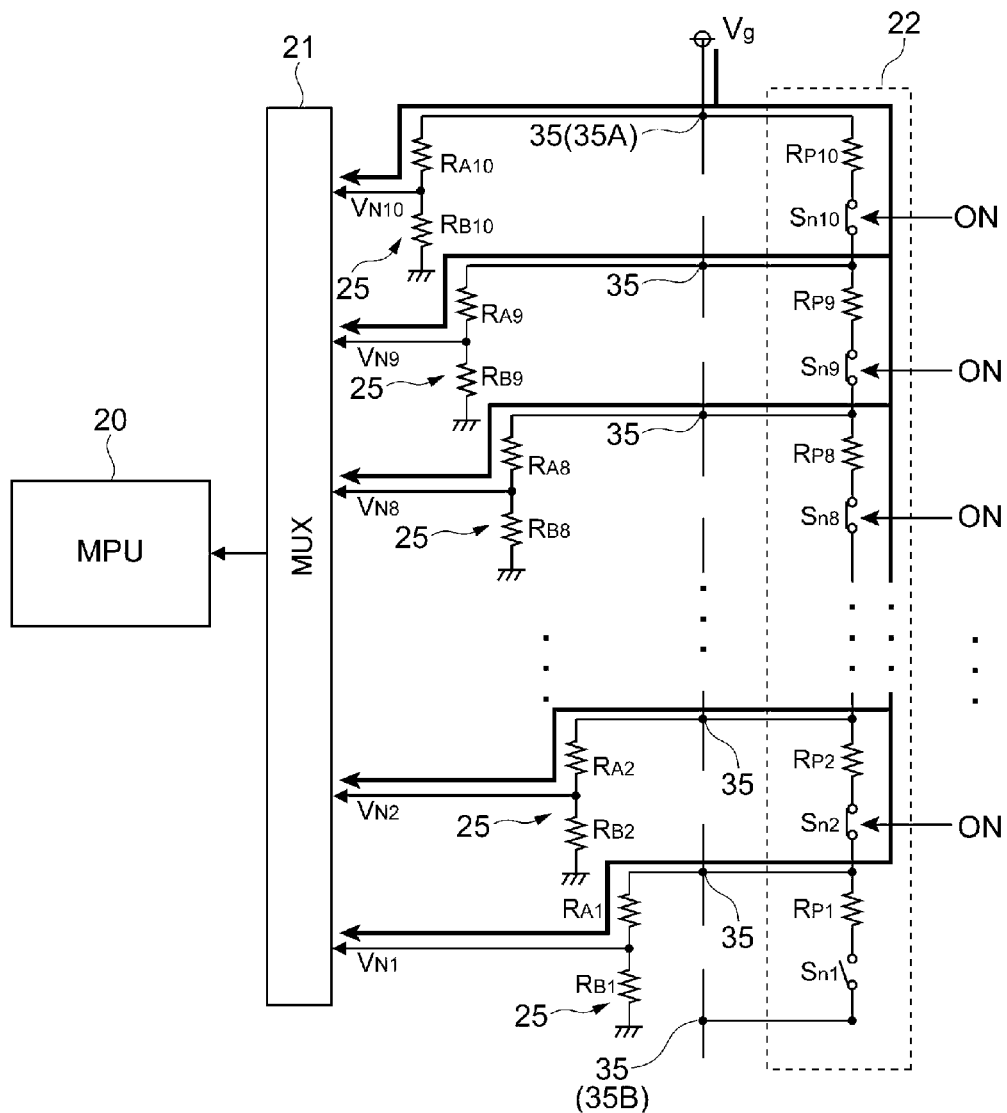
FIG. 3 shows a calibration process for the voltage monitoring device in FIG. 2.

As shown in FIG. 3, in the calibration process, the capacitor unit 50 is removed from the end terminals 35A and 35B, or namely, the capacitors 51 are not connected to the respective terminals 35. As shown in FIG. 1, a calibration mode switch 18 that is connected to ground turns ON. In this state, a prescribed voltage (a known voltage) $V_g$ is applied between the end terminals 35A and 35B. $V_g$ is 5V, for example.

Figure 4:
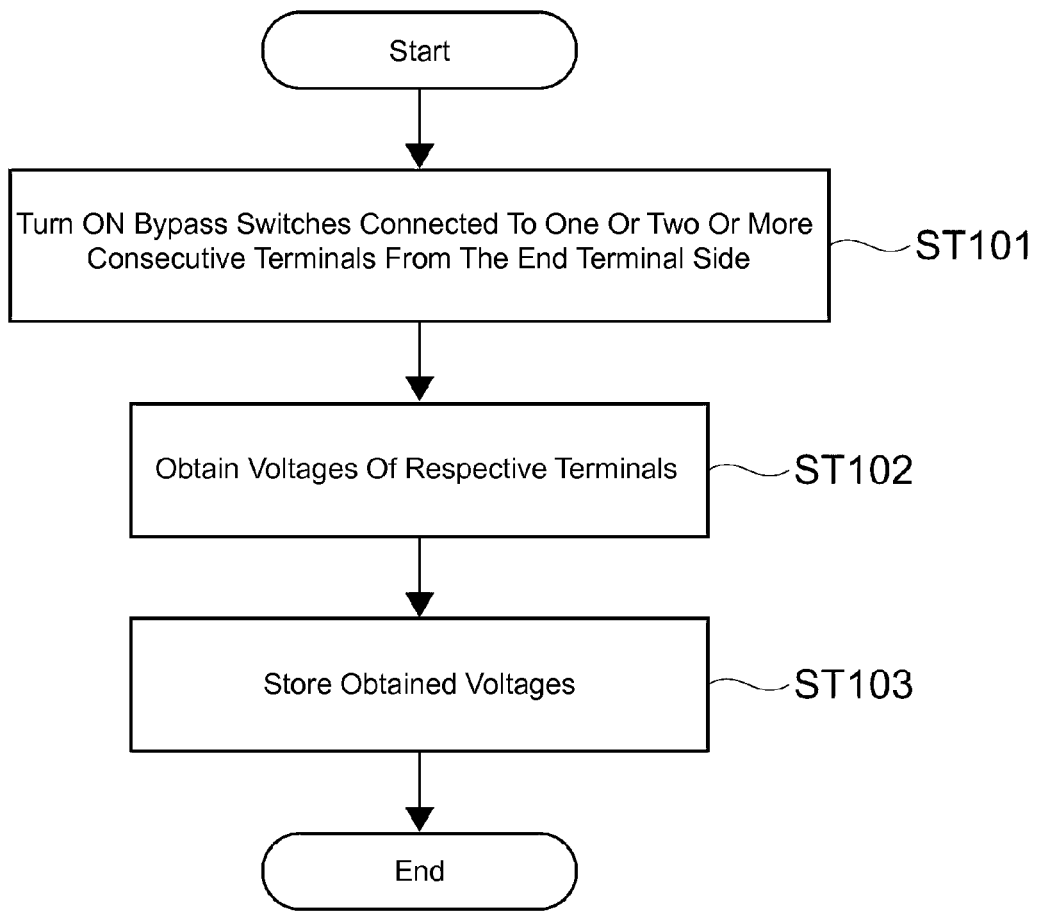
FIG. 4 is a flow chart showing the calibration process.

FIG. 4 is a flow chart of the calibration process by the MPU 20.

Among the bypass switches $S_{n1}, _{n2}, \ldots, S_{s10}$ of the bypass circuit 22, the MPU 20 turns on the bypass switches $S_n$ connected to one terminal or two or more consecutive terminals 35 from the positive end terminal 35A side (step 101). In the present embodiment, the bypass switches $S_{1n10}$ to $S_{n2}$ are ON. In other words, the nine consecutive bypass switches $S_{m10}$ to $S_{n2}$ are ON, but the bypass switch $S_{n1}$ connected between the negative end terminal 35B and the terminal 35 adjacent thereto is OFF.

The MPU 20 obtains, via the respective voltage-dividing circuits 25, the terminal voltages of one terminal or two or more of the terminals 35 that are consecutive, but not the negative end terminal 35B (in the present embodiment, $V_{N10}$, $V_{N9}$, $V_{N8}$, ..., $V_{N2}$, and $V_{N1}$) (step 102).

The MPU 20 writes the obtained terminal voltages ($V_{N10}$ to $V_{N1}$) to the non-volatile memory.

The terminal voltages ($V_{N10}$ to $V_{N1}$) can be represented by the formulae below.

$V_{N10} = V_g \cdot R_{B10}/(R_{A10}+R_{B10})$,
$V_{N9} = V_g \cdot R_{B9}/(R_{A9}+R_{B9})$,
$V_{N8} = V_g \cdot R_{B8}/(R_{A8}+R_{B8})$,
...
...
$V_{N1} = V_g \cdot R_{B1}/(R_{A1}+R_{B1})$ As described above, the calibration process obtains the respective terminal voltages ($V_{N10}$ to $V_{N1}$) as calibration information while the capacitor unit 50 is not connected to the capacitor power supply 100, and then stores this calibration information. In this case, the MPU 20 or non-volatile memory functions as a storage unit that stores calibration information based on the respective terminal voltages.

In practice, the MPU 20 can calculate calibration coefficients $N_{10}$, $N_9$, $N_8$, ..., $N_1$, as described below, from the terminal voltages ($V_{N10}$ to $V_{N1}$) obtained in the manner explained above. The MPU 20 may store these calibration coefficients ($N_{10}$ to $N_1$) as calibration information.

$N_{10} = V_g/V_{N10}$,
$N_9 = V_g/V_{N9}$,
$N_8 = V_g/V_{N8}$,
...
...
$N_1 = V_g/V_{N1}$

4. Operation of Capacitor Power Supply

Figure 5:
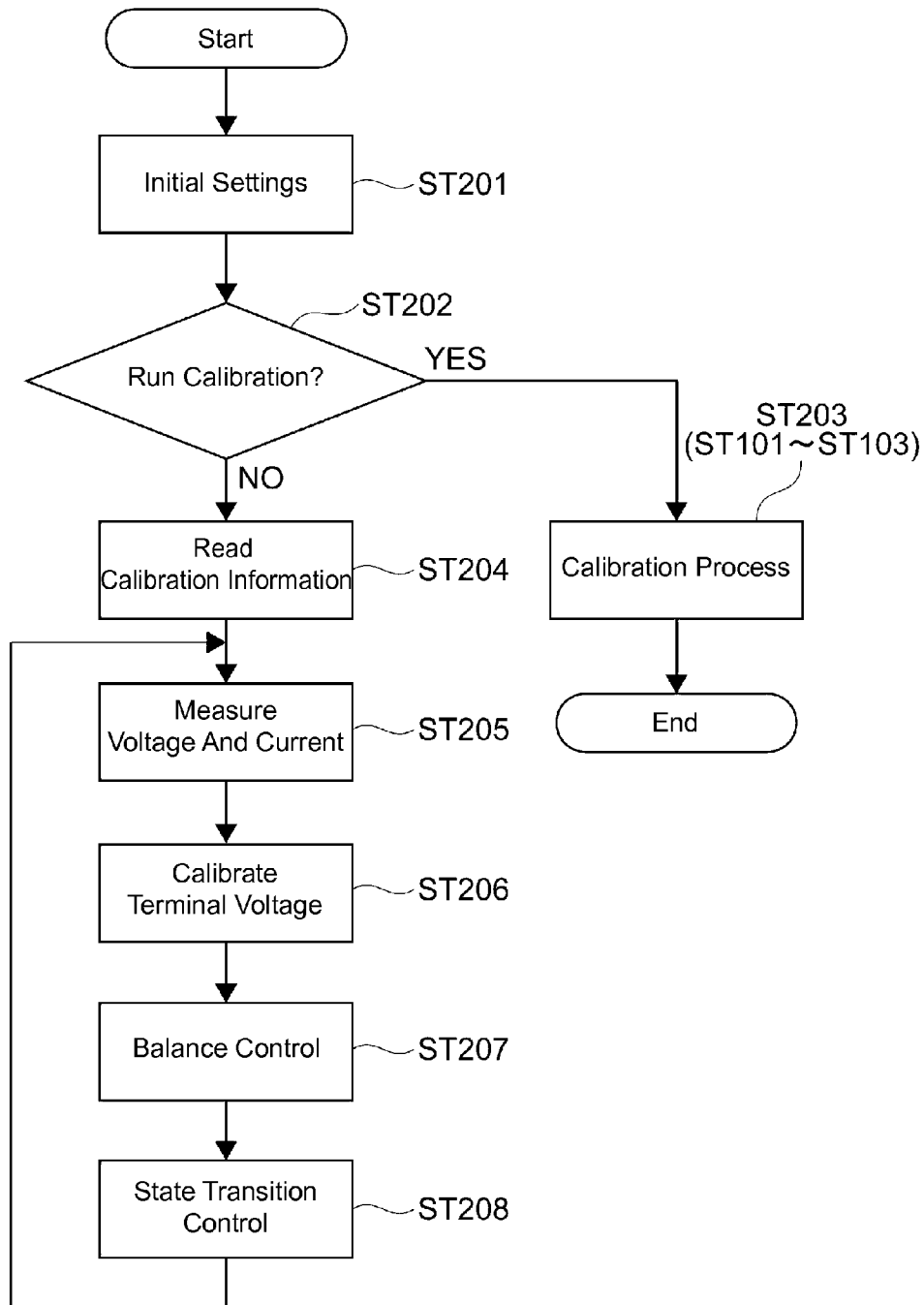
FIG. 5 is a flow chart showing general operation of a capacitor power supply, which includes the voltage monitoring operation.

FIG. 5 is a flow chart of the overall operation of the capacitor power supply, and mainly shows an operation (method of monitoring voltage) including the calibration process described above and a calibration process for the terminal voltages that uses the calibration information obtained by this calibration process.

As shown in FIG. 5, prescribed initial settings are performed first. The initial settings are settings that are necessary during startup of software, hardware, and the like.

After the initial settings, when attempting to run the calibration process while the capacitor unit 50 is removed from the end terminals 35A and 35B (YES in step 202), the MPU 20 proceeds to step 203 and executes the calibration process as shown in FIG. 4 (step 203).

When not running the calibration process (NO in step 202), the capacitor power supply 100 operates normally. In other words, the MPU 20 operates with the capacitor unit 50 being connected to the end terminals 35A and 35B.

First, the MPU 20 reads the calibration information stored in step 103 (see FIG. 4) from the non-volatile memory (step 204).

The MPU 20 measures the respective terminal voltages ($V_{T10}$ to $V_{T1}$) of the capacitor unit 50, and also measures the voltage of the main terminal 11 and the currents in the respective components (step 205). In this case, mainly the MPU 20 functions as at least a voltage detecting unit.

The MPU 20 calibrates the detected voltages on the basis of the calibration information read in step 204 (step 206). In this case, the MPU 20 mainly functions as a calibration unit. Specifically, as shown by the formulae below, the MPU 20 outputs the product of the terminal voltages ($V_{T10}$ to $V_{T1}$) of the capacitor unit 50 multiplied by the respective calibration coefficients ($N_{10}$ to $N_1$) as the calibrated voltages ($V_{10}$ to $V_1$).

$V_{10} = V_{T10} \cdot N_{10} (= V_{T10} \cdot V_g / V_{N10})$,
$V_9 = V_{T9} \cdot N_9 (= V_{T9} \cdot V_g / V_{N9})$,
$V_8 = V_{T8} \cdot N_8 (= V_{T8} \cdot V_g / V_{N8})$,
...
...
$V_1 = V_{T1} \cdot N_1 (= V_{T1} \cdot V_g / V_{N1})$ The MPU 20 runs the balance control described above on the basis of the voltages ($V_{10}$ to $V_1$) calibrated in this manner, or namely, the voltages ($V_{10}$ to $V_1$) measured with a high degree of accuracy (step 207). The MPU 20 also runs the state transition control (step 208). The state transition control will be described later.

As described above, the MPU 20 calibrates the respective detected terminal voltages ($V_{T10}$ to $V_{T1}$) on the basis of the respective terminal voltages ($V_{N10}$ to $V_{N1}$) that were detected when the capacitors 51 were not connected to the respective terminals 35. The terminal voltages ($V_{N10}$ to $V_{N1}$) are voltages that reflect variation caused by individual differences of the components and the like included in the various types of circuits (such as the components in the MPU 20, the voltage-dividing circuits 25, and the bypass resistors $R_{Pn}$, for example). Accordingly, the MPU 20 can absorb these variations through calibration, thereby making it possible to increase measurement accuracy of the voltages of the respective capacitors 51. As a result, balance control can be performed with a high degree of accuracy.

Examples of individual differences in components in the MPU 20 include deviations caused by offset of the reference potential, deviations in voltage sensitivity of the AD converter, and the like.

In the present embodiment, even if the accuracy of voltage division by the voltage-dividing circuits 25 is low, the deviations in the voltage division can be absorbed by the calibration process.

In the present embodiment, it is practically possible to short circuit the respective terminals 35 by the bypass resistors $R_{Pn}$ having a resistance that is sufficiently lower than the resistance of the respective resistors $R_{An}$ and $R_{Bn}$ of the voltage-dividing circuits 25 when the respective bypass switches $S_n$ are closed. This is the same as using a jig such as a connection cable to short circuit the terminals, thus it is not necessary to use a jig such as a connection cable.

In practice, the resistance of the bypass resistors $R_{Pn}$ is not 0, but the voltage drop caused by the resistance of the bypass resistors $R_{Pn}$ is sufficiently smaller than the voltage drop caused by the voltage-dividing circuits 25, and is negligible. Accordingly, it is possible to ignore the resistance of this bypass circuit 22 during voltage detection of the respective terminals 35. The calibration information, however, is based on the voltages detected during this voltage drop caused by these bypass resistors $R_{Pn}$; therefore, in the present embodiment, it is possible to obtain voltage information with a high degree of accuracy from the capacitors 51 during this subtle voltage drop when the capacitors 51 are connected.

Figure 6:
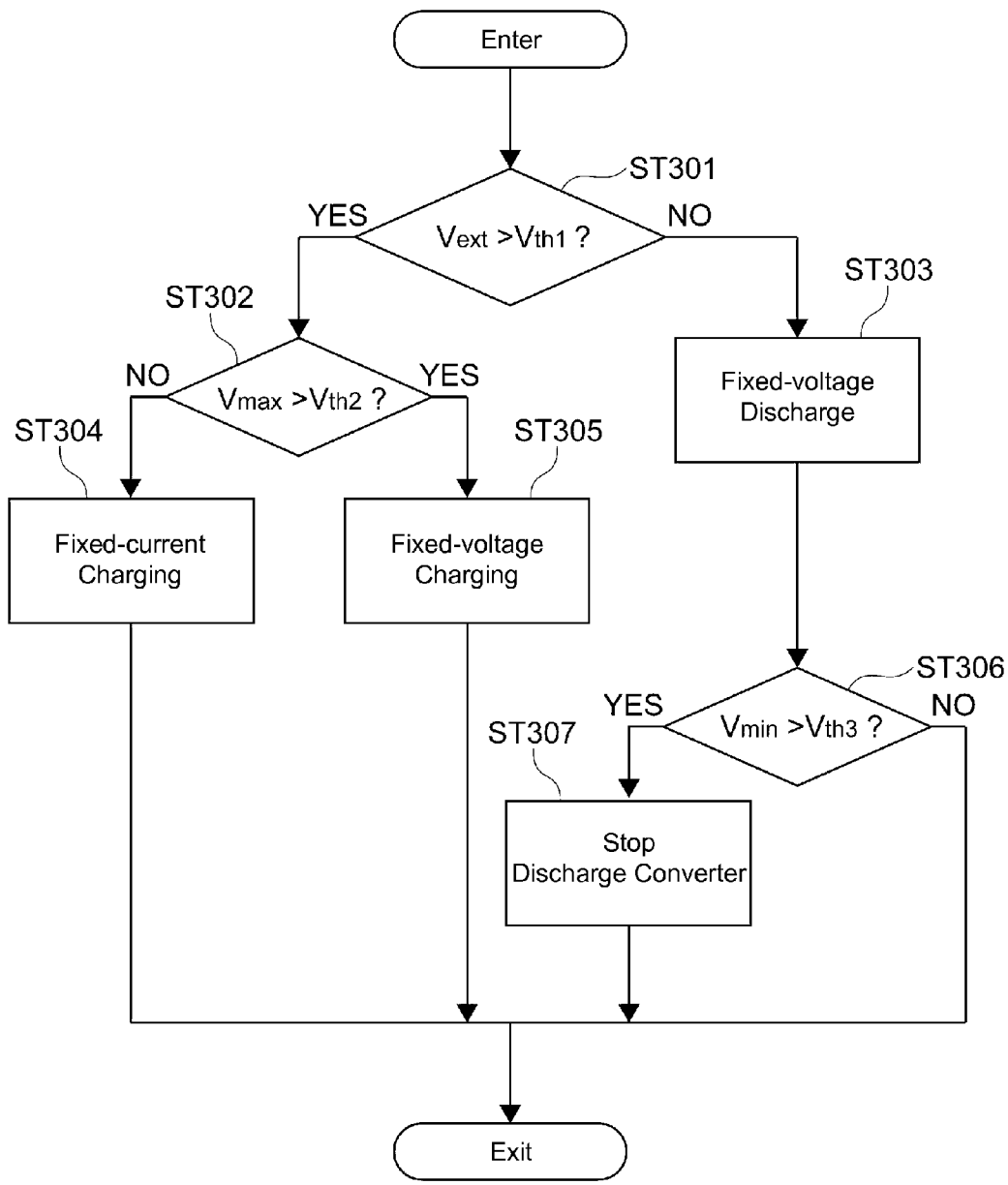
FIG. 6 is a flow chart showing the state transition control process in FIG. 5.

FIG. 6 is a flow chart of the state transition control process of step 208 in FIG. 5.

As shown in FIG. 6, when an input voltage $V_{ext}$ of the main terminal 11 detected in step 205 exceeds a threshold $V_{th1}$ (YES in step 301), the MPU 20 proceeds to step 302. If the threshold is not exceeded, the MPU 20 proceeds to step 303. The threshold $V_{th1}$ can be 25V (=rated voltage 24V +prescribed voltage 1V), for example.

If YES in step 301, the MPU 20 judges that a power source for charging is connected between the main terminals 11 and 12, or namely, that the device is charging.

The MPU 20 performs constant-current charging if a maximum voltage $V_{max}$ allowed by the respective terminals 35 of the capacitor unit 50 during charging exceeds a threshold $V_{th2}$, for example (YES in step 302) (step 304). In other words, the MPU 20 controls the step-up converter 23 such that the current flowing to the capacitor unit 50 is a prescribed fixed value (design value). The threshold $V_{th2}$ is set at 3.8V, which is the maximum voltage of the respective capacitors 51, for example.

The MPU 20 performs constant-voltage charging if the maximum voltage $V_{max}$ is the threshold $V_{th2}$ or below (NO in step 302) (step 305). In other words, the MPU 20 controls the step-up converter 23 such that the respective terminal voltages (the calibrated voltage $V_{10}$ of the end terminal 35A, for example) of the capacitor unit 50 are prescribed fixed values (design values).

If NO in step 301, the MPU 20 judges that a load is connected between the main terminals 11 and 12, or namely, that the device is discharging.

If in a discharge state, the MPU 20 controls the step-down converter 24 such that the output voltage from the main terminal 11 detected in step 205 is maintained at a prescribed value (rated voltage 24V, for example) (step 303).

In this case, the MPU 20 stops the operation of the step-down converter 24 if a minimum voltage $V_{min}$ of the respective terminal voltages (the calibrated voltage $V_{10}$ of the end terminal 35A, for example) of the capacitor unit 50 is lower than a threshold $V_{th3}$ (2.2V, for example) (YES in step 306).

The capacitor power supply 100 realizes the state transition control by the charging/discharging control described above.

5. Other Embodiments

The present invention is not limited to the embodiment described above, and various other embodiments can be used.

Figure 7:
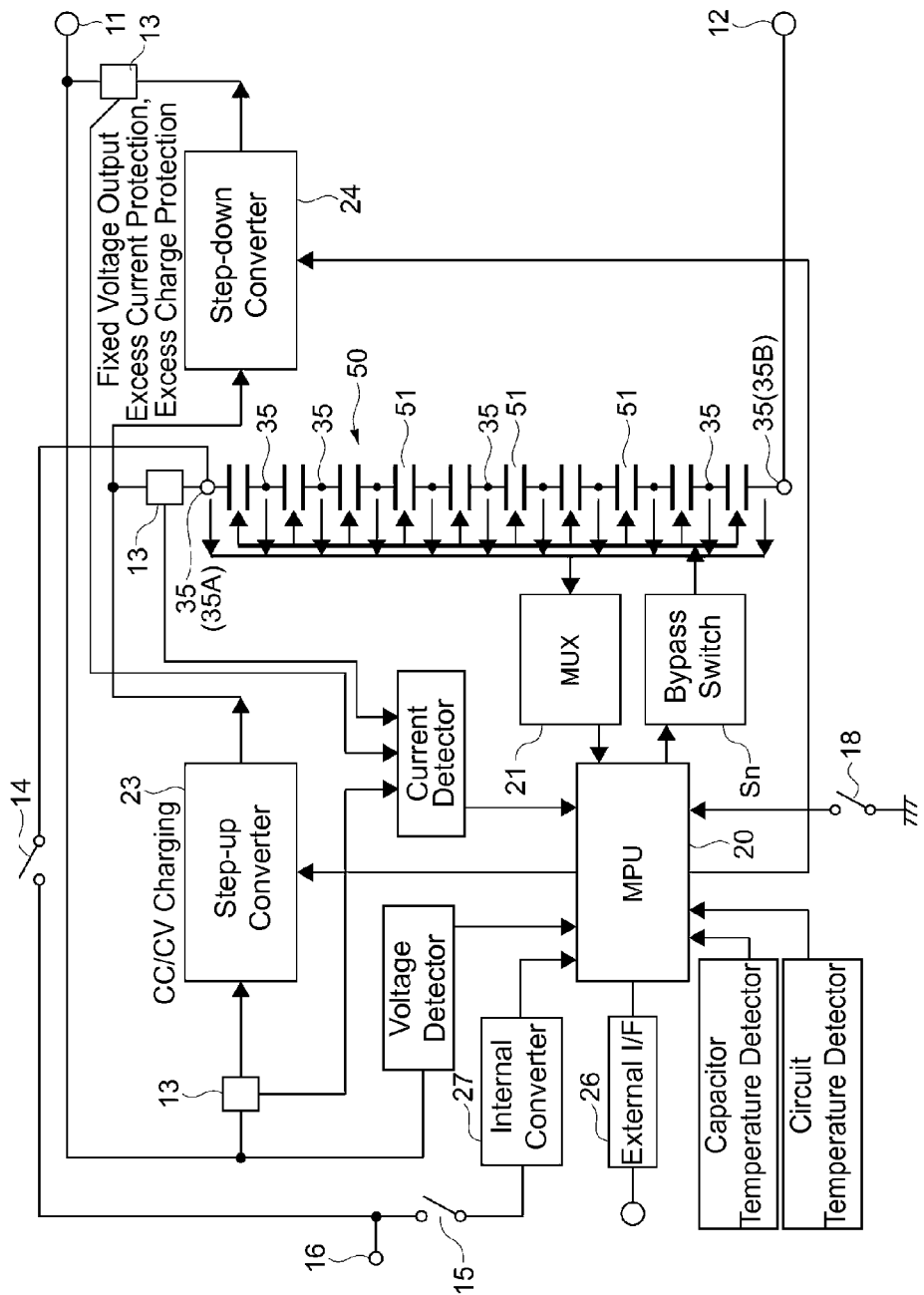
FIG. 7 is a block diagram showing a functional configuration of a capacitor power supply according to another embodiment of the present invention.

As shown in FIG. 7, a prescribed voltage (a known voltage) may be externally applied via an internal converter 27 in a calibration process. This capacitor power supply includes a main switch 15 that connects an external terminal to the converter 27, and a normal operation switch 14 disposed between this main switch 15 and a main terminal 11.

During the calibration process, the main switch 15 turns ON (the normal operation switch 14 is OFF) while a prescribed voltage (22 to 40V, for example) is externally applied to the external terminal 16, for example. The converter 27 outputs a prescribed voltage (5V, for example) applied to the end terminal 35A described above and inputs this to an MPU, for example. Thereafter, it is possible to replicate the state in which the 5V voltage is applied to the MPU while a capacitor unit 50 is not connected between the terminals 35A and 35B. This enables the MPU to run a process that is similar to the calibration process in FIG. 4 described above. In this case, the converter 27 may have circuits that are equivalent to the voltage-dividing circuits 25 described above.

If the capacitor power supply is operating normally, an MPU 20 turns the main switch 15 OFF and stops the voltage being applied to the terminal 16. In the step 202, the MPU 20 can run the processes after step 204 with both the main switch 15 and the normal operation switch 14 turned ON.

Balance control of the voltage monitoring device of the embodiment described above is realized through passive control by the bypass circuit 22, but balance control may be realized through active control that actively controls the respective terminal voltages. Alternatively, without being limited to the balance control described in the above embodiment, various well-known balance controls can be applied to the present technology.

In step 101 of the above embodiment (see FIG. 4), the bottommost switch $S_1$ (bottommost voltage side) was OFF and the other switches $S_{10}$ to $S_1$ were ON. However, when there is one terminal or two or more consecutive terminals from the end terminal 35A, if there are terminals that require calibration and terminals that do not require calibration among these terminals, then the switches $S_n$ continuing upward that include the terminals that need calibration may be turned ON.

The capacitor unit 50 may be a plurality of single groups that are each constituted of a plurality of the capacitors 51 connected in series, and this plurality of groups may be respectively connected in parallel. In other words, m amount of groups of n amount of the capacitors 51 connected in series may be connected in parallel such that the capacitor unit 50 has nxm amount of the capacitors 51.

During the manufacturing of the capacitor power supply, the voltage division by the voltage-dividing circuits 25 may be intentionally changed for at least every two of the terminals 35 among the respective terminals 35, for example. In this case, the voltage division can be configured such that the detection voltage inputted to the AD converter of the MPU 20 is a suitable level (ignoring quantizing errors during AD).

The number of the serially-connected capacitors 51 included in the capacitor unit 50 is a large number (several dozen, for example), and if the voltage division is intentionally changed for each terminal 35 as described above, then quantizing errors during AD will not be negligible during the calibration process. In this case, it is possible to apply two or more types of prescribed voltages (conventional voltages) to two or more locations of the capacitor unit.

It is possible to combine at least two featured portions among the featured portions of the respective embodiments described above.

What is claimed is:

1. A capacitor power supply, comprising:
    a plurality of terminals including a first terminal and a second terminal that are on respective ends of said plurality of terminals, the plurality of terminals being configured to connect a plurality of capacitors in series when the capacitors are inserted between respective terminals;
    a bypass circuit having bypass switches connected in parallel between the respective terminals that constitute the plurality of terminals;
    a voltage detecting unit that can detect a voltage of at least terminals among the plurality of terminals other than the second terminal;
    a storage unit that stores calibration information that is determined based on a voltage detected by the voltage detecting unit when a prescribed voltage is inputted between the first terminal and the second terminal while the plurality of capacitors are not respectively connected to the plurality of terminals and while one or more of the bypass switches that are consecutive from a side of the first terminal are closed; and
    a calibration unit that calibrates voltages detected by the voltage detecting unit based on the calibration information when the plurality of capacitors are respectively connected to the plurality of terminals.

2. The capacitor power supply according to claim 1, wherein the storage unit stores the calibration information on the basis of the voltage detected when the bypass switches other than the bypass switch connected between the first second terminal and the terminal adjacent thereto are closed.

3. The capacitor power supply according to claim 2, further comprising voltage-dividing resistor circuits respectively connected to the terminals other than the second terminal, wherein the voltage detecting unit detects the respective voltages of the terminals whose voltages have been divided by the voltage-diving resistors.

4. The capacitor power supply according to claim 3, wherein the bypass circuit has bypass resistors that are respectively connected in series to the respective bypass switches and that have a lower resistance than resistors included in the respective voltage-dividing resistors.

5. The capacitor power supply according to claim 1, further comprising voltage-dividing resistor circuits respectively connected to the terminals other than the second terminal, wherein the voltage detecting unit detects the respective voltages of the terminals whose voltages have been divided by the voltage-diving resistors.

6. The capacitor power supply according to claim 5, wherein the bypass circuit has bypass resistors that are respectively connected in series to the respective bypass switches and that have a lower resistance than resistors included in the respective voltage-dividing resistors.

* * * * *